US006346442B1

(12) United States Patent
Aloni et al.

(10) Patent No.: US 6,346,442 B1
(45) Date of Patent: Feb. 12, 2002

(54) METHODS FOR FABRICATING A SEMICONDUCTOR CHIP HAVING CMOS DEVICES AND A FIELDLESS ARRAY

(75) Inventors: Efraim Aloni, Haifa; Shai Kfir, Kiryat Tivon; Menchem Vofsy, Kiryat Tivon; Avi Ben-Guigui, Kiryat Tivon, all of (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 0 days.

(21) Appl. No.: 09/244,316

(22) Filed: Feb. 4, 1999

(51) Int. Cl.[7] .............................................. H01L 21/336
(52) U.S. Cl. ...................... 438/258; 438/216; 438/261; 438/266; 438/279; 438/287
(58) Field of Search ................................. 438/216, 211, 438/257, 258, 261, 262, 263, 264, 275, 279, 287, 289, 298, 299, 301, 302, 305, 306, 525, 526, 591, 594, 954, 266

(56) References Cited

U.S. PATENT DOCUMENTS

| 5,168,334 A | * 12/1992 | Mitchell et al. ............ 257/324 |
| 6,030,871 A | * 12/1992 | Eitan .......................... 438/276 |
| 5,436,481 A | * 7/1995 | Egawa et al. ............... 257/324 |
| 5,768,192 A | 6/1998 | Eitan |
| 5,966,603 A | * 10/1999 | Eitan .......................... 438/258 |
| 5,985,718 A | * 11/1999 | Dalla Libera et al. ....... 438/264 |

* cited by examiner

Primary Examiner—Charles Bowers
Assistant Examiner—Jack Chen
(74) Attorney, Agent, or Firm—E. Eric Hoffman; Law Offices of Bever, Hoffman & Harms, LLP

(57) ABSTRACT

A fieldless array of floating gate transistors is fabricated by forming an oxide-nitride-oxide (ONO) layer over a semiconductor substrate. A mask is formed over the ONO layer, the mask having openings that define a plurality of bit line regions of the floating gate transistors in the substrate. A first impurity is implanted into the bit line regions of the substrate, wherein the first impurity is implanted through the ONO layer, through the openings of the mask. The first impurity is implanted at various angles, such that the first impurity is implanted in the substrate at locations beneath the mask. The upper oxide and nitride layers of the ONO layer are subsequently etched through the mask openings. A second impurity is implanted in the substrate through the openings of the mask. The mask is removed, and the substrate is oxidized, thereby forming bit line oxide regions over the bit line regions, and floating gate structures. A plurality of gate electrodes are formed over the bit line oxide regions and the floating gate structures, thereby completing the fieldless array of floating gate transistors. Process steps are also provided for fabricating high voltage and low voltage CMOS transistors on the same wafer as the fieldless array.

17 Claims, 12 Drawing Sheets

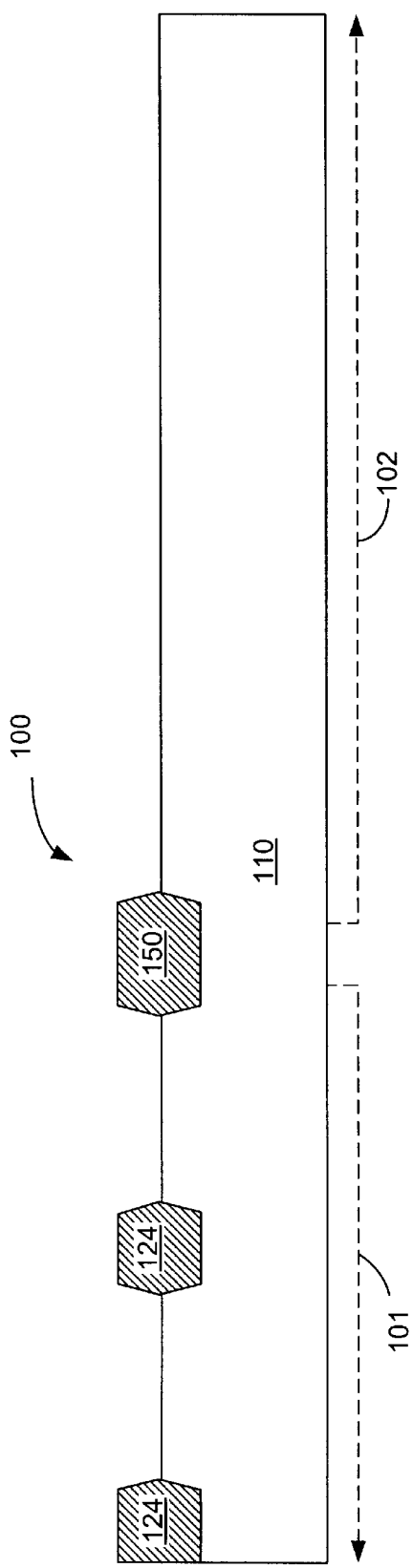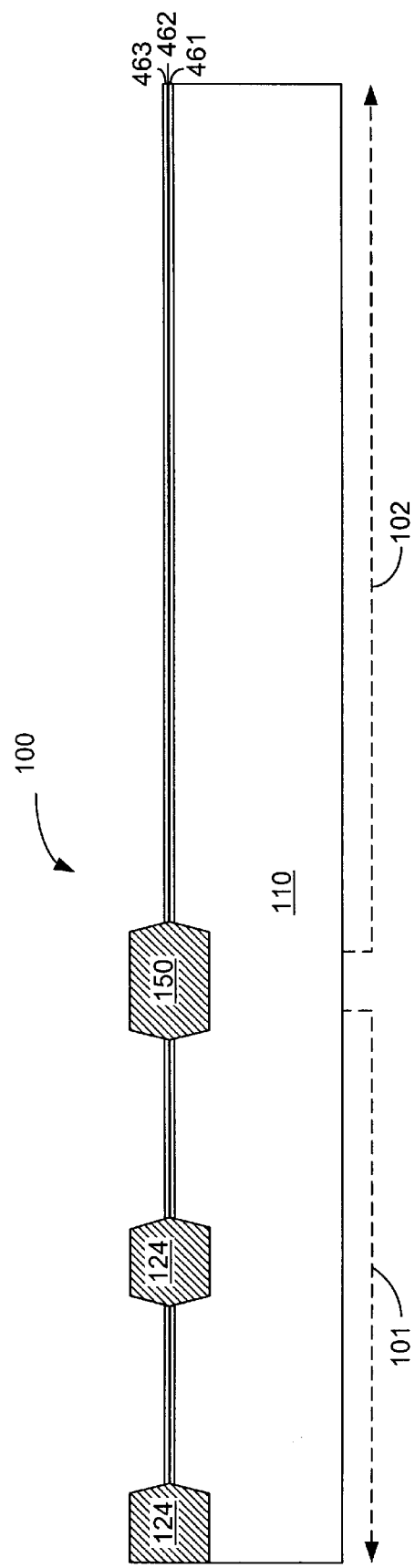

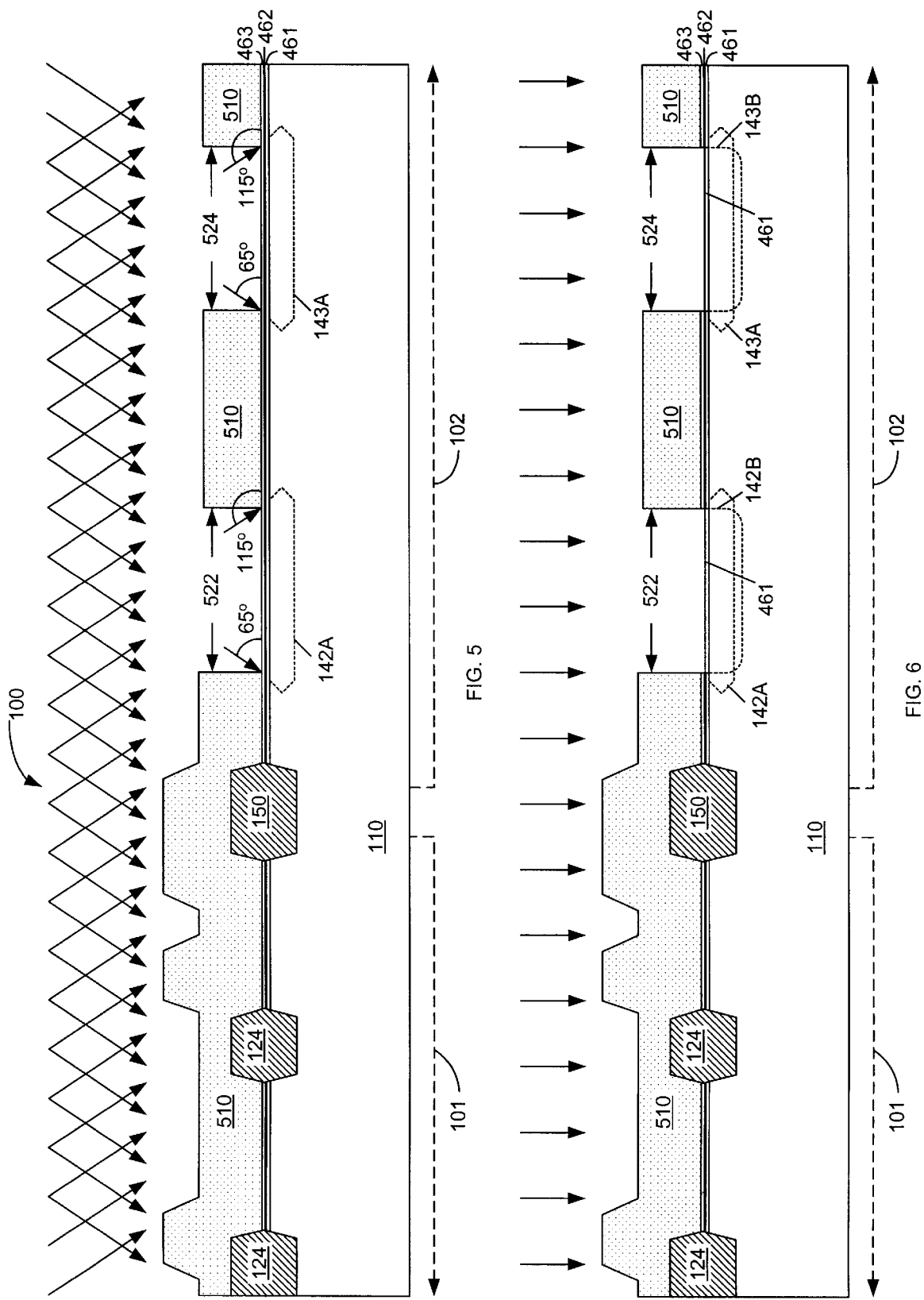

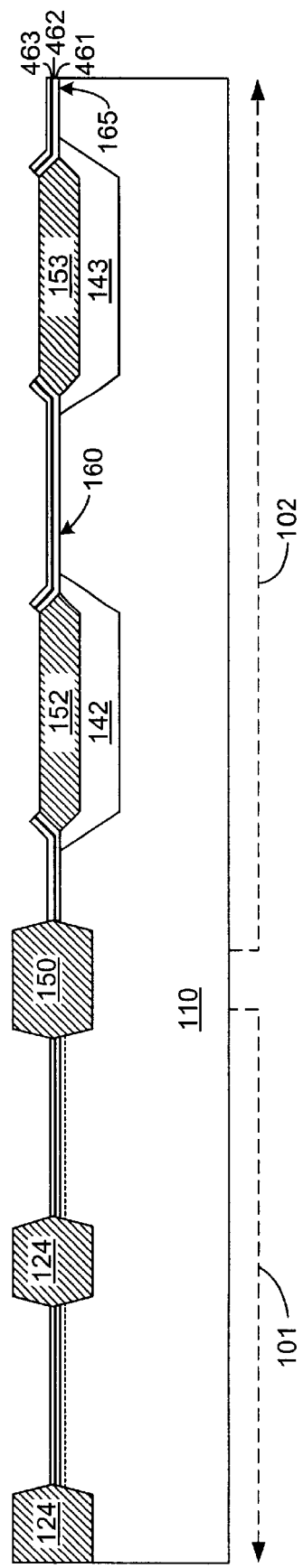

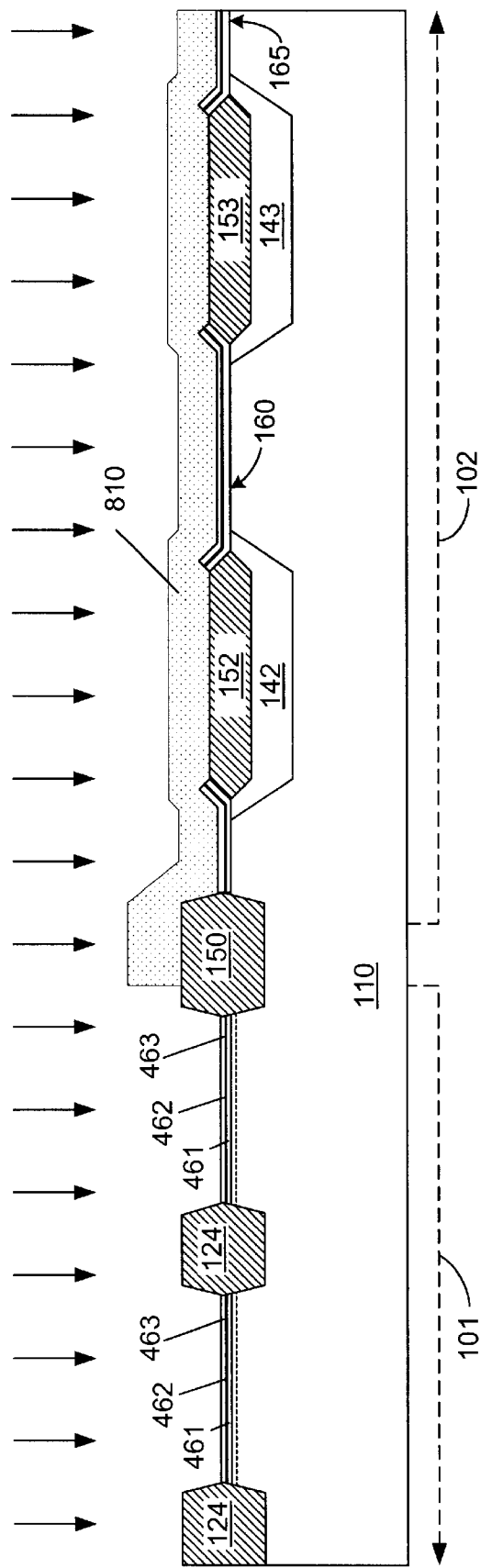
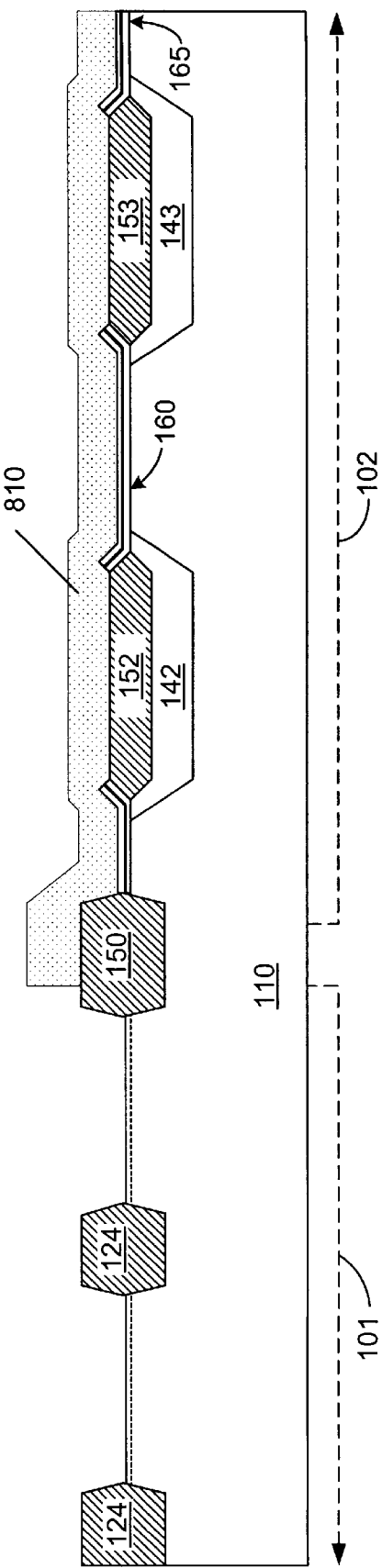
FIG. 8
FIG. 9

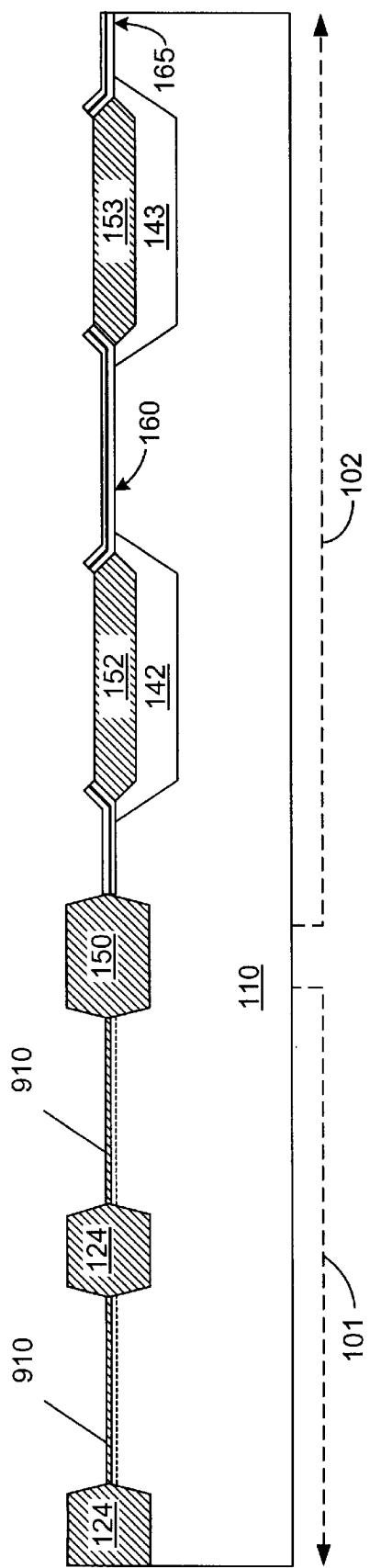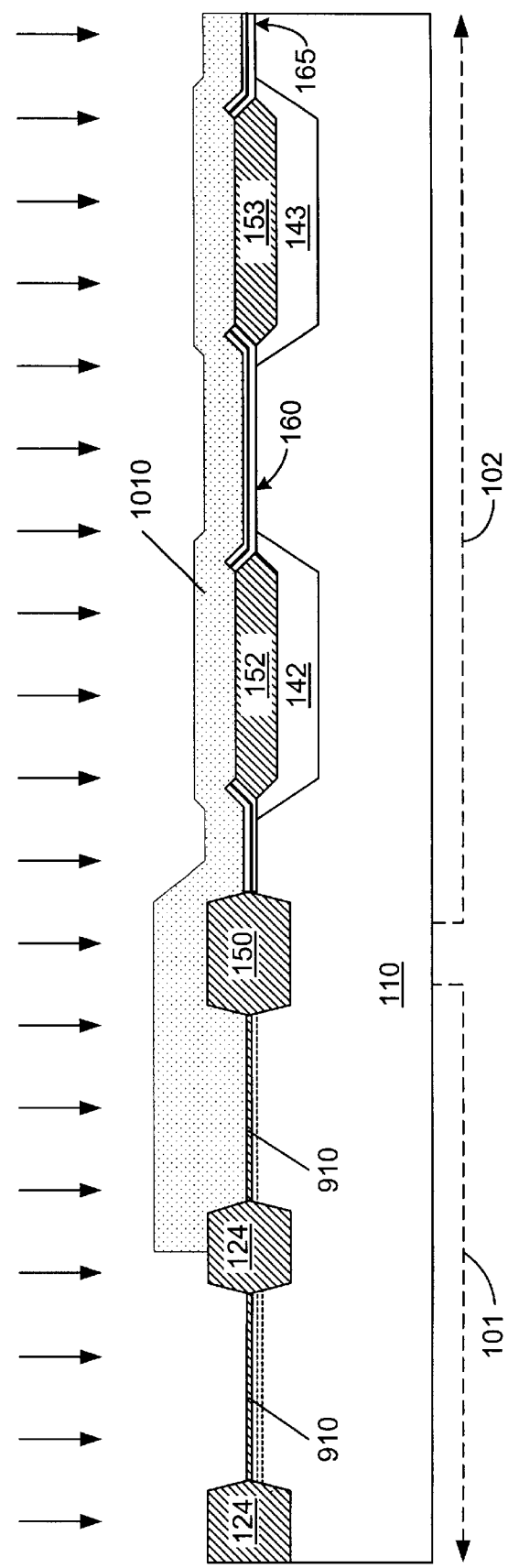

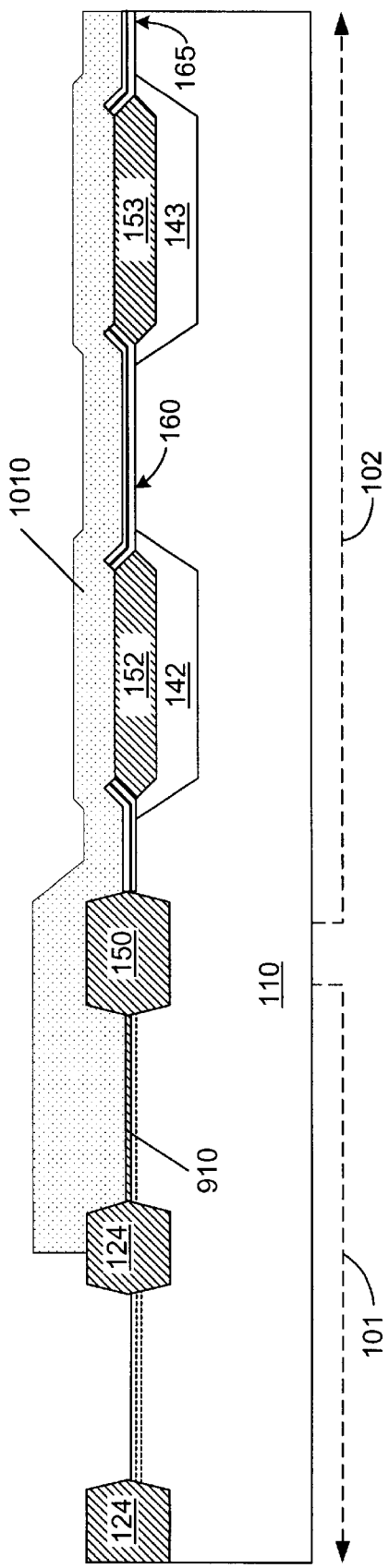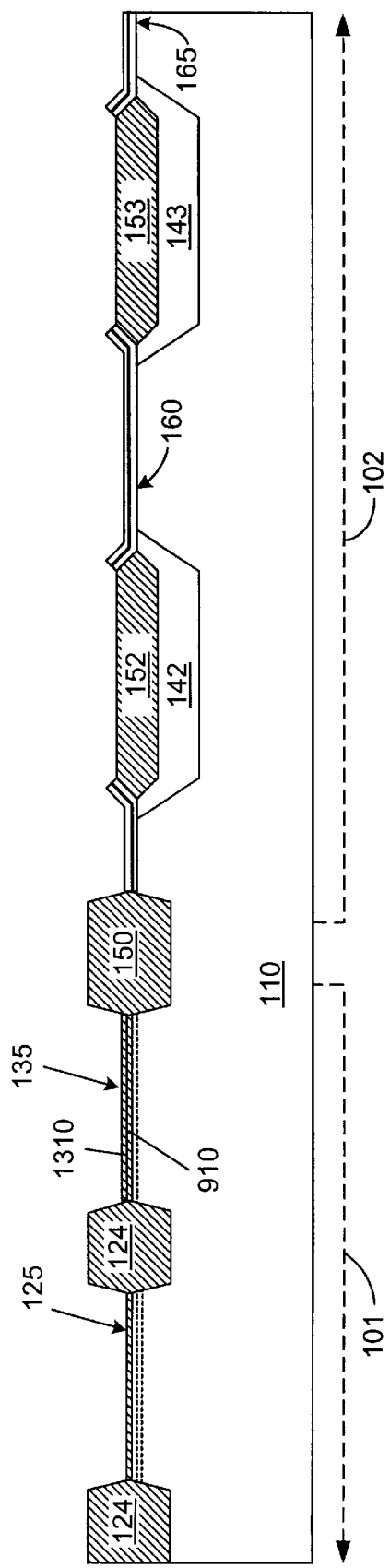

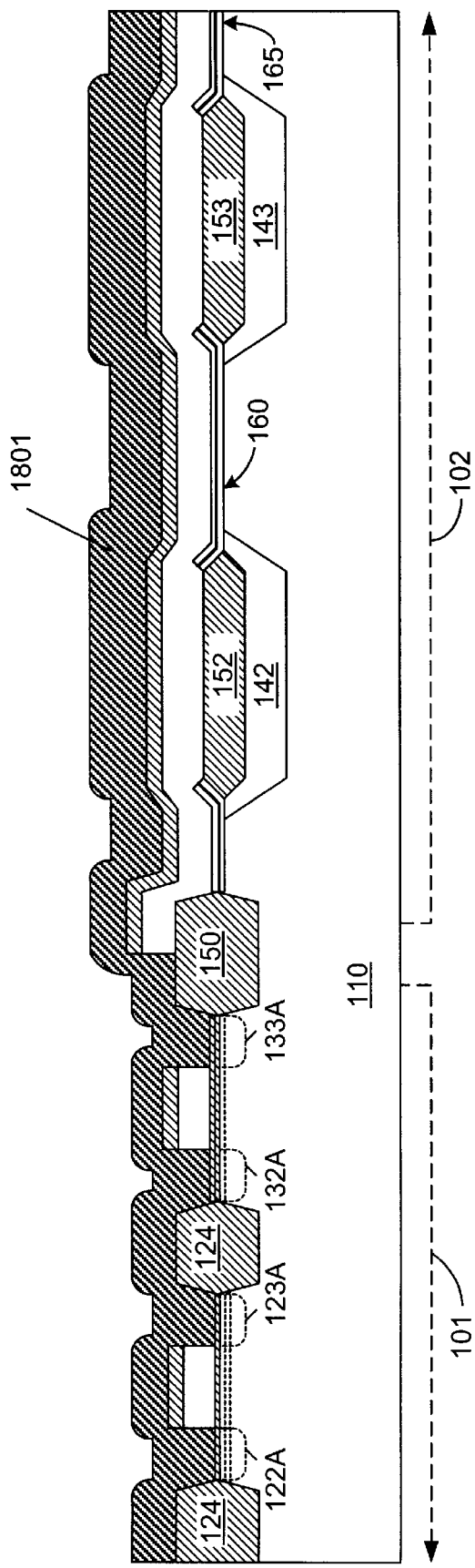
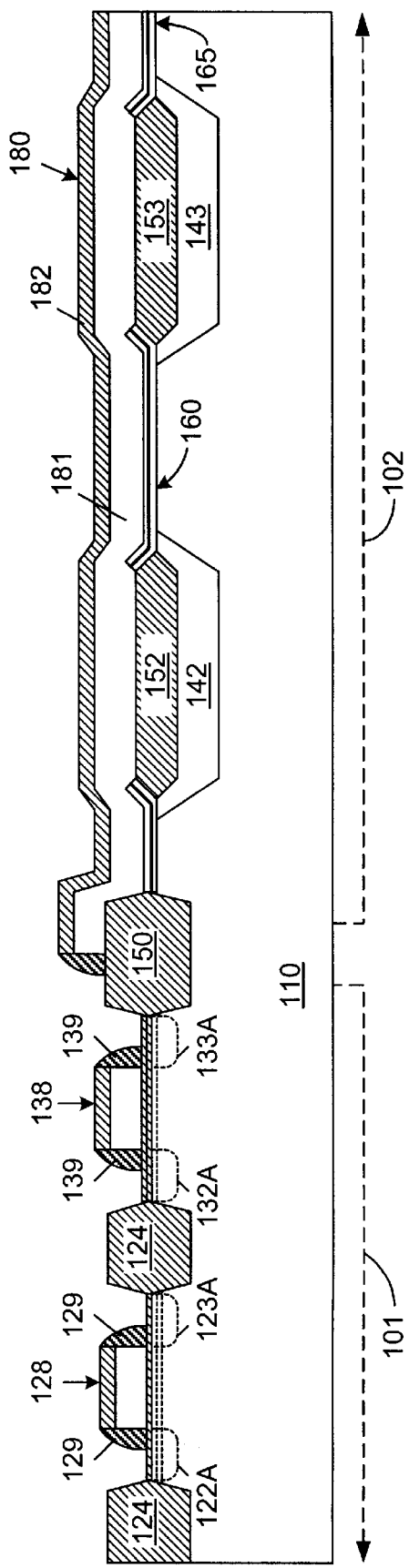
FIG. 18
FIG. 19

METHODS FOR FABRICATING A
SEMICONDUCTOR CHIP HAVING CMOS
DEVICES AND A FIELDLESS ARRAY

FIELD OF THE INVENTION

The present invention relates to the fabrication of a semiconductor device. More specifically, the present invention relates to a method of fabricating a semiconductor device that includes a first region containing CMOS logic devices and a second region containing a fieldless array of memory transistors.

BACKGROUND OF THE INVENTION

In many memory applications, memory transistors and conventional CMOS devices are fabricated on a single semiconductor wafer. Typically, the CMOS devices are fabricated in a first region of the wafer, while the memory transistors are fabricated in a second region of the wafer. On some wafers, the memory transistors are fabricated as part of a fieldless array. A fieldless array is defined as an array that does not use field oxide to isolate the various elements of the array. Because field oxide is not required to isolate the memory transistors in a fieldless array, the memory transistors can be laid out with a relatively high density.

In certain applications, conventional CMOS devices (e.g., transistors) are fabricated in the second region, but do not form part of the fieldless array. That is, the CMOS devices located in the second region are isolated by field oxide. Thus, the second region can include both memory transistors and CMOS devices.

In order to distinguish the above-described transistors, the following nomenclature will be used. As used herein, the term "logic transistor" refers to a transistor fabricated in accordance with conventional CMOS processes, regardless of whether the transistor is fabricated in the first region or the second region of the semiconductor wafer. A CMOS logic transistor is isolated from other elements by field oxide. CMOS logic transistors can further be classified as high voltage CMOS logic transistors and low voltage CMOS logic transistors. High voltage CMOS logic transistors have a thicker gate oxide than low voltage CMOS logic transistors, thereby enabling the high voltage CMOS logic transistors to withstand higher gate voltages. The term "fieldless array transistor" refers to a floating gate type non-volatile memory transistor that is used to form a fieldless array. A fieldless array transistor does not require field oxide isolation.

The process steps required to fabricate high and low voltage CMOS logic transistors are not fully compatible with the process steps required to fabricate fieldless array transistors. As a result, relatively complex processes would be required to form the high and low voltage CMOS logic transistors and the fieldless array transistors on the same wafer. It would therefore be desirable to have an efficient process for fabricating high and low voltage CMOS logic transistors and fieldless array transistors on the same wafer.

SUMMARY OF THE INVENTION

Accordingly, the present invention provides efficient processes for fabricating high voltage CMOS logic transistors, low voltage CMOS logic transistors and fieldless array transistors on the same wafer.

In accordance with one embodiment, the fieldless array transistors are fabricated by forming a first dielectric layer over a semiconductor substrate, forming a floating gate layer over the first dielectric layer, and then forming a second dielectric layer over the floating gate layer. The floating gate layer and/or the interfaces between the floating gate layer and the first and second dielectric layers function as a charge storage or charge trapping region. In a particular embodiment, the first and second dielectric layers are silicon oxide, and the floating gate layer is silicon nitride, thereby forming an oxide-nitride-oxide (ONO) structure. A mask having a plurality of openings is formed over the second dielectric layer. The openings in the mask define locations in the substrate that will be used to form diffusion bit lines, as well as source and drain regions, of the fieldless array transistors. These locations are referred to as bit line regions.

A first impurity is implanted through the openings of the mask into the bit line regions of the substrate. The first impurity passes through the second dielectric layer, the floating gate layer, and the first dielectric layer before reaching the substrate. In a particular embodiment, the first impurity is implanted at a first angle and then a second angle with respect to the upper surface of the substrate. For example, the first impurity can be implanted at angles of 65 degrees and 115 degrees. Under these conditions, the first impurity is implanted in the substrate at locations beneath the mask. The first impurity has a first conductivity type (e.g., p-type).

The second dielectric layer and the floating gate layer are etched through the openings of the mask. In accordance with one embodiment, the second dielectric layer (and a portion of the floating gate layer) are etched by a low pressure isotropic plasma enhanced etch in a vacuum chamber using only a flourocarbon gas, such as $CF_4$. The second dielectric layer is removed by a plasma assisted isotropic etch that uses a gas mixture of $SF_6$ and HBr in the same vacuum chamber. A second impurity can then be implanted through the openings of the mask at an angle of about 90 degrees with respect to the upper surface of the substrate. The second impurity is implanted into the bit line regions of the substrate. The second impurity has a second conductivity type, opposite the first conductivity type (e.g., n-type).

The mask is removed, and an oxidation step is subsequently performed. The oxidation step results in the formation of bit line oxide regions at the locations where the second dielectric layer and the floating gate layer were previously etched (i.e., over the bit line regions). Floating gate structures, which include the first dielectric layer, the floating gate layer and the second dielectric layer, are formed at the locations where the second dielectric layer and the floating gate layer were not previously etched.

The oxidation step activates the first impurity and the second impurity in the substrate (with subsequent high temperature steps completing the activation). In general, the first impurity adjusts the threshold voltages of the fieldless array transistors. The second impurity forms the diffusion bit line conductors, as well as the source and drain regions, of the fieldless array transistors. A plurality of gate electrodes are formed over the bit line oxide regions and the floating gate structures, thereby completing the fieldless array transistors. The bit line oxide isolates the diffusion bit line conductors from the gate electrodes.

In accordance with another aspect of the present invention, high voltage and low voltage CMOS transistors are fabricated on the same wafer as the fieldless array using an efficient series of process steps. In a particular embodiment, the low voltage transistors are fabricated in a first region of the substrate and the high voltage transistors are fabricated in a second region of the substrate. A first ion implant is initially performed in both the first and second regions. The first ion implant is selected to adjust the threshold voltages of the high voltage transistors in the desired manner. In one embodiment, the first ion implant is performed through the above-mentioned ONO structure.

The ONO structure is removed in the first and second regions and a first gate oxide is then formed over both the first and second regions of the semiconductor substrate. A second ion implant is then performed into only the first region of the substrate. The first region therefore receives both the first and second ion implants. The combination of the first and second ion implants adjusts the threshold voltages of the low voltage transistors in the desired manner.

The first gate oxide is then removed from first region of the substrate. A second gate oxide is then formed over both the first and second regions of the substrate. The second gate oxide forms the gate oxide layer for the low voltage transistors in the first region. In the second region, the second gate oxide combines with the previously formed first gate oxide to form the gate oxide layer for the high voltage transistors in the second region.

The above-described process steps advantageously enable high voltage CMOS transistors, low voltage CMOS transistors and fieldless array transistors to be fabricated on the same wafer in an efficient manner. The present invention will be more fully understood in view of the following description and drawings.

BRIEF DESCRIPTION OF THE DRAWINGS

FIGS. 3–21 are cross sectional views illustrating process steps used to fabricate the semiconductor device of FIG. 1 in accordance with one embodiment of the present invention.

DETAILED DESCRIPTION

Figure 1:
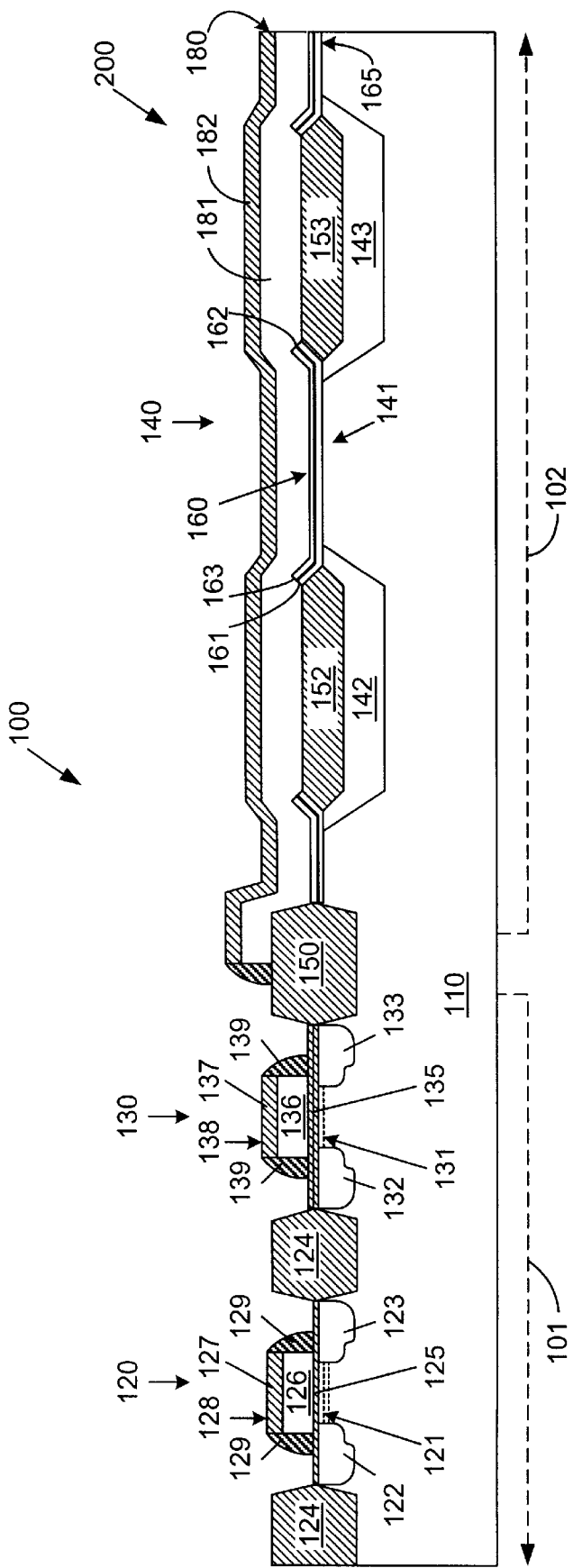
FIG. 1 is a cross sectional view of a semiconductor device that includes a low voltage CMOS logic transistor, a high voltage CMOS logic transistor and a fieldless array transistor in accordance with one embodiment of the present invention.

FIG. 1 is a cross sectional view of a semiconductor device 100 that is fabricated in accordance with one embodiment of the present invention. Semiconductor device 100 is divided into a first region 101 and a second region 102. First region 101 and second region 102 are separated by border field oxide 150. Conventional CMOS devices are fabricated in first region 101, while a fieldless array of transistors 200 is fabricated in second region 102. In addition to the fieldless array, CMOS devices (not shown) are also fabricated in second region 102. The various elements of semiconductor device 100 are not shown to scale.

Semiconductor device 100 includes n-channel field effect transistors 120 and 130 fabricated in the first region 101 of semiconductor substrate 110. In the described embodiment, transistor 120 is a conventional low voltage CMOS logic transistor, and transistor 130 is a conventional high voltage CMOS logic transistor. As used herein, high voltage transistors have thicker gate oxides than low voltage transistors and thus can accommodate higher gate voltages as compared to low voltage transistors. It is understood that first region 101 will typically include many other CMOS devices.

Semiconductor device 100 also includes a floating gate type n-channel field effect transistor 140 fabricated in second region 102 of semiconductor substrate 110. In the described embodiment, transistor 140 is a fieldless array transistor which is used as non-volatile memory cell.

Low voltage logic transistor 120 includes N+ type source and drain regions 122 and 123, P-type channel region 121, gate oxide layer 125, conductively doped polycrystalline silicon (polysilicon) gate 126, metal silicide layer 127 and electrically insulating sidewall spacers 129. Together, polysilicon gate 126 and metal silicide layer 127 form a polycide control gate 128 for logic transistor 120.

High voltage logic transistor 130 includes N+ type source and drain regions 132 and 133, P-type channel region 131, gate oxide layer 135, conductively doped polycrystalline silicon (polysilicon) gate 136, metal silicide layer 137 and electrically insulating sidewall spacers 139. Together, polysilicon gate 136 and metal silicide layer 137 form a polycide control gate 138 for logic transistor 130.

Fieldless array transistor 140 includes a P-type channel region 141 and N+ type diffusion bit lines 142 and 143, which act as the source and drain regions of fieldless array transistor 140. Bit line oxide regions 152 and 153 are located over buried diffusion bit lines 142 and 143, respectively. Portions of buried diffusion bit lines 142 and 143 extend laterally beyond the edges of bit line oxide regions 152 and 153. Fieldless array transistor 140 also includes a floating gate structure 160 formed from silicon oxide layer 161, silicon nitride layer 162, and silicon oxide layer 163. Floating gate structure 160 is sometimes referred to as an ONO structure because of the oxide-nitride-oxide layering of the structure. A conductively doped polysilicon layer 181 overlies bit line oxide regions 152–153 and floating gate structure 160. A metal silicide layer 182 overlies polysilicon layer 181. Metal silicide layer 182 and polysilicon layer 181 collectively form polycide control gate 180 of fieldless array transistor 140. Bit line oxide regions 152 and 153 isolate buried diffusion bit lines 142 and 143 from polycide control gate 180.

In the described embodiment, fieldless array transistor 140 is connected to a plurality of other fieldless array transistors to form a fieldless array. The fieldless array transistors share control gates and diffusion bit lines in a manner which is described below.

Figure 2:
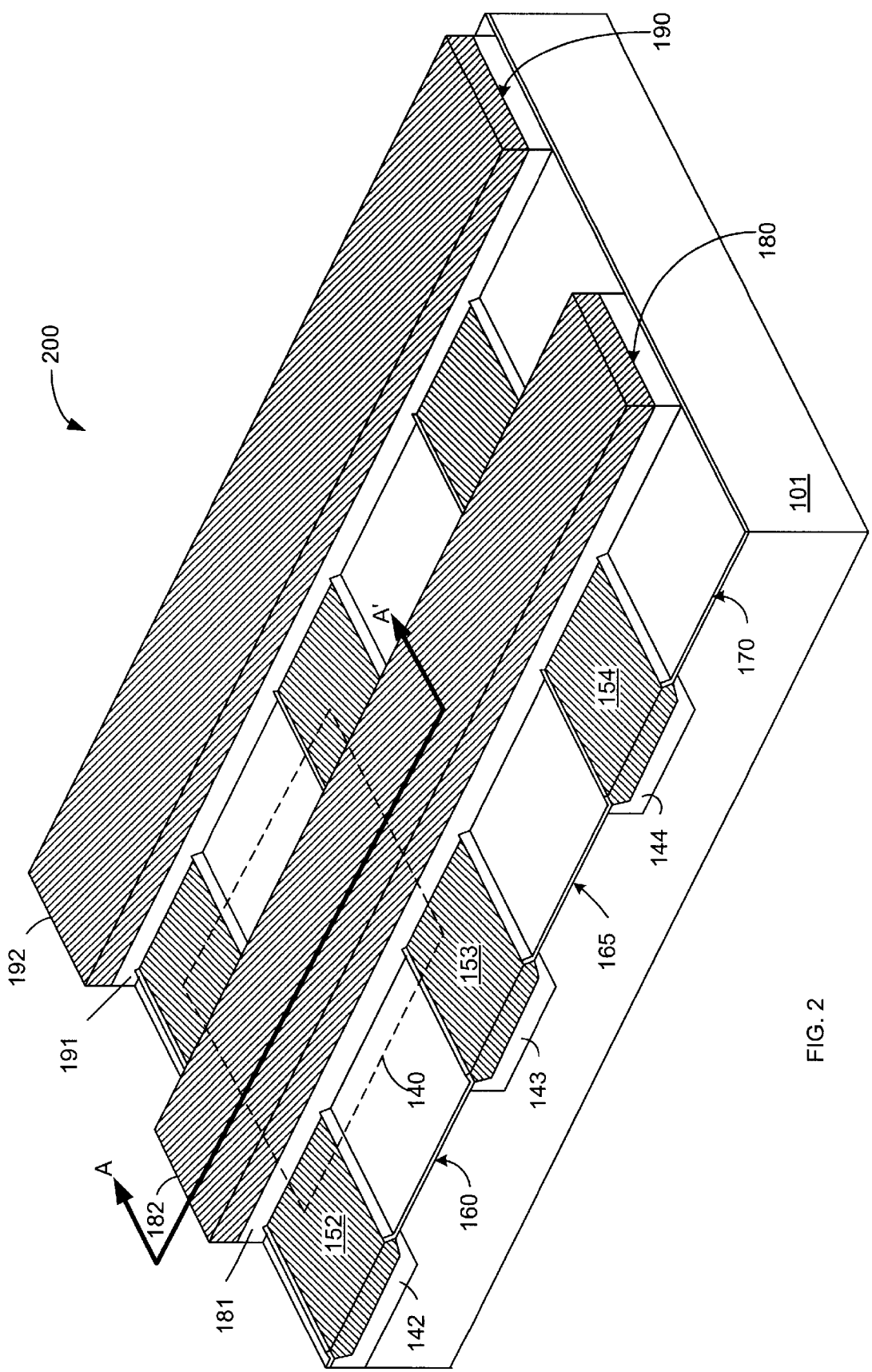
FIG. 2 is an isometric view of a portion of a fieldless array in accordance with one embodiment of the present invention.

FIG. 2 is an isometric view of a portion of the fieldless array 200 that is fabricated in second region 140. Fieldless array transistor 140 is identified by dashed lines in FIG. 2. The cross sectional view of fieldless array 200 illustrated in FIG. 1 is taken along section line A–A' of FIG. 2.

Fieldless array 200 includes a plurality of diffusion bit lines 142, 143, 144 that extend in parallel along a first axis. Each of buried bit lines 142, 143, 144 is covered by a corresponding bit line oxide layer 152, 153, 154. ONO structures 160, 165, 170 extend in parallel along the first axis, between adjacent diffusion bit lines. For example, ONO structure 160 is located between diffusion bit lines 142 and 143, with the ends of ONO structure 160 extending over the edges of diffusion bit lines 142–143 and the edges of bit line oxide layers 152–153. Polycide control gate electrodes 180 and 190 extend in parallel along a second axis that is perpendicular to the first axis. Polycide control gate 180 was described above. Polycide control electrode 190 includes conductively doped polysilicon layer 191 and metal silicide layer 190. As explained above, diffusion bit lines 142 and 143 form the source and drain, respectively, of fieldless array transistor 140. However, diffusion bit lines 142 and 143 also form the source and drain, respectively, of an adjacent transistor that includes polycide control gate 190 and ONO structure 160. Thus, the sources and drains of the fieldless array transistors extend laterally beyond the gates of these transistors. Furthermore, diffusion bit line 143 also forms the source in another adjacent transistor which includes polycide control gate 180, ONO structure 165 and diffusion bit line 144 (which forms the drain of this adjacent transistor). The operation of fieldless array 200 is described in more detail in commonly owned co-filed U.S. patent application Ser. No. 09/244,529, by Yoav Lavi and Ishai Nachumovsky, entitled "EEPROM ARRAY USING 2-BIT NON-VOLATILE MEMORY CELLS AND METHOD OF IMPLEMENTING SAME", commonly owned co-filed U.S. patent application Ser. No. 09/244,317, by Ishai Nachumovsky, entitled "EEPROM ARRAY USING 2-BIT NON-VOLATILE MEMORY CELLS WITH SERIAL READ OPERATIONS", and commonly owned co-pending U.S. patent application Ser. No. 09/243,976, by Oleg Dadashev, entitled, "BIT LINE CONTROL CIRCUIT FOR A MEMORY ARRAY USING 2-BIT NON-VOLATILE MEMORY CELLS".

FIGS. 3–21 illustrate process steps used to form semiconductor device 100 in accordance with one embodiment of the present invention. The described process is a twin-well process. Initially the high voltage n-wells are formed within substrate 101, followed by the low voltage n-wells and the p-wells. These well regions are not illustrated in the Figures for purposes of clarity. However, it is understood that the fieldless array is fabricated in a p-well, and that n-channel CMOS logic transistors 120 and 130 are fabricated in a p-well. (P-channel devices are fabricated in the n-wells.)

As illustrated in FIG. 3, the required field oxide is then formed. The illustrated field oxide includes border field oxide 150 and CMOS field oxide regions 124. The field oxide is thermally grown in accordance with conventional CMOS processing techniques (e.g., locos) to a thickness in the range of about 3000 to 8000 Å, or more particularly, in the range of about 5000 to 7500 Å. In the described embodiment, the field oxide is grown to a thickness of about 6000 Å. It is noted in conventional CMOS processing, after the field oxide is grown, a sacrificial oxide is grown, and a threshold voltage implant is typically performed through the sacrificial oxide. In accordance with one aspect of the present invention, after the field oxide is grown, a sacrificial oxide is grown and then etched in a diluted hydrofluoric (HF) acid, with no intermediate step. That is, no threshold voltage implant is performed through the sacrificial oxide. The required threshold voltage implants are performed as described in more detail below.

Turning now to FIG. 4, after the field oxide has been grown, a dielectric layer 461 is deposited or created on the surface of semiconductor device 100. A floating gate layer 462 is then deposited on the upper surface of dielectric layer 461. Then, a dielectric layer 463 is either deposited or created on floating gate layer 462. In the described embodiment, dielectric layer 461 is a layer of silicon oxide having a thickness in the range of about 40 to 200 angstroms. In another embodiment, dielectric layer 461 has a thickness in the range of about 50 to 150 angstroms. In the described embodiment, dielectric layer 461 has a thickness of approximately 70 angstroms, created by thermally oxidizing the upper surface of semiconductor substrate 110. Floating gate layer 462 is formed by depositing a layer of silicon nitride having a thickness in the range of 80 to 200 angstroms. In another embodiment, floating gate layer 462 has a thickness in the range of 90 to 150 angstroms. In the described embodiment, floating gate layer 462 has a thickness of approximately 135 angstroms over silicon oxide layer 461. The upper surface of silicon nitride layer 462 is thermally oxidized, thereby creating silicon oxide layer 463. Silicon nitride layer 462 is very stable layer and requires a high temperature in the presence of hydrogen and oxygen to create silicon oxide at a reasonable rate. In one embodiment, this high temperature is in the range of 850 to 1100° C. In another embodiment, the high temperature is in the range of 950 to 1100° C. In the described embodiment, the high temperature is about 1000° C. The silicon oxide layer promotes charge retention in silicon nitride layer 462 during operation. Oxidization of silicon nitride layer 462 reduces the thickness of silicon nitride layer 462 to approximately 30 to 150 angstroms, while creating silicon oxide layer 463 having a thickness in the range of 30 to 150 angstroms. In another embodiment, the thickness of silicon nitride layer 462 is reduced to a thickness in the range of about 50 to 120 angstroms, while silicon oxide layer 463 has a thickness in the range of 50 to 150 angstroms. In the described embodiment, the thickness of silicon nitride layer 462 is reduced to about 75 angstroms, and silicon oxide layer 463 has a thickness of approximately 100 angstroms. In one embodiment, the combined thickness of silicon oxide layer 461, silicon nitride layer 462, and silicon oxide layer 463 is approximately 120 to 550 angstroms. In the described embodiment, the combined thickness of layers 461–463 is in the range of about 200–250 angstroms. The combined thickness of these layers 461–463 is therefore negligible compared to the thickness of the field oxide 124, 150. Therefore, FIGS. 4–21 do not show layers 461–463 over field oxide 124, 150, even though these layers are present.

In an alternative embodiment, silicon nitride layer 462 is not oxidized to form silicon oxide layer 463. Instead, silicon oxide layer 463 is deposited over silicon nitride layer 462. In this embodiment, silicon nitride layer 462 has a thickness in the range of 40 to 200 angstroms, and silicon oxide layer 463 has a thickness in the range of 50 to 150 angstroms. In a particular embodiment, silicon nitride layer 462 has a thickness of about 100 angstroms, and silicon oxide layer 463 has a thickness of about 100 angstroms.

A layer of photoresist is then deposited over the upper surface of semiconductor device 100. This photoresist layer is exposed and developed to create a photoresist mask 510 having openings 522 and 524, as illustrated in FIG. 5. Openings 522 and 524 are located to define the diffusion bit lines of fieldless array 200. More specifically, openings 522 and 524 define the locations of diffusion bit lines 142 and 143, respectively. High angle implants are then performed through openings 522 and 524. More specifically, a P-type impurity, such as boron, is implanted through upper silicon oxide layer 463, silicon nitride layer 462, and lower silicon oxide layer 461 through openings 522 and 524 of photoresist mask 510 at acute and obtuse angles with respect to the surface of semiconductor substrate 110, such that the dopant extends under the edges of photoresist mask 510. In accordance with one embodiment of the present invention, each of the two high angle implants is performed by implanting P-type impurities with a dopant density in the range of 1e12 to 5e14 ions/cm$^2$, depending on the implantation energy, which is in the range of 20 to 80 KeV. In the described embodiment, each of the two high angle implants is performed with a dopant density of about 1e13 ions/cm$^2$ and an implantation energy of 60 KeV. In one embodiment, one high angle implant is performed at an angle in the range of 45 to 75 degrees from the surface of substrate 110, and the other high angle implant is performed at an angle in the range of 105 to 135 degrees from the surface of substrate 110. In the described embodiment, the high angle implants are performed at angles of approximately 65 degrees and 115 degrees from the surface of substrate 110. The implanted boron serves to adjust the threshold voltages of the fieldless array transistors. The implanted p-type impurities are illustrated as 142A and 143A in FIG. 5.

In an alternative embodiment, an additional counter doping implant can be implemented. The counter doping implant is performed by implanting an n-type impurity, such as phosphor, using parameters similar to the parameters of the above-described high angle implants. The n-type impurity provides improved junction edge optimization. In yet another embodiment, counter doping is achieved by performing a blanket low energy implant of an n-type impurity over the entire array, prior to the formation of photoresist mask 510.

After performing the high angle implants, the portions of upper silicon oxide layer 463 and silicon nitride layer 462 that are exposed by openings 522 and 524 are removed. In one embodiment, these layers are removed by a two step dry etch, which is performed by a low pressure, high density plasma etcher. The first process step removes the exposed portions of upper silicon oxide layer 463 by flowing only a flourocarbon gas, such as $CF_4$, at a flow rate of about 50 to 200 standard cubic centimeters per minute (sccm) in a 3.2 liter etcher in a plasma assisted isotropic etch that uses plasma power ranging from 200 to 400 Watts and a low pressure that ranges from 5 to 15 milli-Torr. The etch time is calculated to remove all of the exposed portions of upper silicon oxide layer 463, and part of the underlying silicon nitride layer 462. In one embodiment, the etch time is approximately 20 to 50 seconds. The second process step is an isotropic etch that removes the exposed portions of silicon nitride layer 462 using $SF_6$ and HBr as the etching gases. The second etch is selective to oxide, thereby protecting the underlying silicon oxide layer 461. The time of the second etch is long enough to assure complete removal of the exposed portions of silicon nitride layer 462, and the selectivity of the second etch is high enough to assure at least 30–50 Å of lower oxide layer 461 remain. The second etch only partially etches the lower silicon oxide layer 461. Note that the underlying silicon substrate 110 is not exposed through any part of lower silicon oxide layer 461. The wafer is maintained at a temperature of about 10° C. to about 100° C. during the above-described etch steps. The resulting structure is illustrated in FIG. 6.

Both the first and second etch steps are isotropic etches that use non-directed plasma. As a result, zero proximity effect (micro-loading) is achieved, and ion bombardment is reduced to a minimum level. Zero proximity effect, also called micro-loading, exists when the etch rate in a small feature area is the same as the etch rate in a large feature area.

An N-type impurity, such as arsenic, is then implanted through openings 522 and 524 of photoresist mask 510. In one embodiment, arsenic is implanted with a dopant density in the range of 1e14 to 6e15 ions/cm$^2$ and an implantation energy in the range of 25 to 100 KeV. In another embodiment, arsenic is implanted with a dopant density in the range of 5e14 to 5e15 ions/cm$^2$ and an implantation energy in the range of 30 to 100 KeV. In the described embodiment, arsenic is implanted with a dopant density of 3e15 ions/cm$^2$ and an implantation energy of 50 KeV. The implanted N-type impurities are illustrated as 142B and 143B in FIG. 6.

Photoresist mask 510 is then stripped, and a thermal oxidation step is performed, thereby creating bit line oxide regions 152 and 153. (FIG. 7) The growth of bit line oxide regions 152 and 153 causes the portions of silicon nitride layer 462, and silicon oxide layer 463 which are adjacent to bit line oxide regions 152 and 153 to bend upward, thus forming floating gate structures 160 and 165. In one embodiment, bit line oxide is thermally grown using a wet oxidation process at a temperature in the range of 750 to 900° C. to a thickness in the range of 300 to 1000 angstroms. In another embodiment, bit line oxide is thermally grown using a wet oxidation process at a temperature in the range of 750 to 900° C. to a thickness in the range of 400 to 850 angstroms. In the described embodiment, bit line oxide is thermally grown using a wet oxidation process at a temperature of about 800° C. to a thickness of about 600 angstroms. This oxidation step also activates and diffuses the implanted impurities in regions 142A–142B and 143A–143B, thereby forming diffusion bit lines 142 and 143. Note that diffusion bit lines 142 and 143 diffuse under the floating gate structures 160 and 165 as illustrated. (Subsequent high temperature processing steps complete the activation of the implanted impurities in regions 142A–142B and 143A–143B). Normally, the relatively low temperature of 800° C. would result in very slow oxidation of silicon. However, the heavy doping of diffusion bit lines 142 and 143 increases the rate of silicon oxidation by approximately a factor of four. Consequently, low temperature oxidation at 800° C., which provides better control, can be used.

Another layer of photoresist material is then deposited over the upper surface of the resulting structure. This photoresist layer is exposed and developed to form photoresist mask 810. (FIG. 8) As illustrated in FIG. 8, photoresist mask 810 exposes first region 101 and covers second region 102. It is noted that specific zones in second region 102 might also be exposed at this time, thereby allowing logic transistors to be fabricated in second region 102 in the manner suggested above. An implant to adjust the threshold voltages of the high voltage CMOS logic transistors is then performed. In the described embodiment, this high voltage threshold implant is performed by implanting a P-type impurity, such as boron, to adjust the threshold voltage of the high voltage transistors. In accordance with one embodiment of the present invention, the P-type impurities are implanted with a dopant density in the range of 5e11 to 1e13 ions/cm$^2$ and an implantation energy in the range of 20 to 50 KeV. In another embodiment, the P-type impurities are implanted with a dopant density in the range of 5e11 to 6e12 ions/cm$^2$ and an implantation energy in the range of 20 to 40 KeV. In the described embodiment, the p-type impurities are implanted with a dopant density of 2.15e12 ions/cm$^2$ and with an implantation energy of 30 KeV. The high voltage threshold implant is illustrated by a single dashed line in substrate 110.

A series of etches are then performed to remove the exposed portions of upper silicon oxide layer 463, silicon nitride layer 462, and lower silicon oxide layer 461. In one embodiment of the present invention, upper silicon oxide layer 463 is first removed with a wet etch in a 6:1 buffered oxide etchant (BOE) at 24° C. for 15 seconds. Silicon nitride layer 462 is then removed with a dry etch that is performed, for example, by an RIE polynitride etcher. In the described embodiment, the dry etch uses one process step in which a mixture of $SF_6$ and HBr gases, along with oxygen, are used to remove the silicon nitride in a timed etch. This dry etch has a high selectivity to the underlying silicon oxide layer 461. The lower silicon oxide layer 461 is wet etched in a 6:1 BOE for about 18 seconds, thereby removing this layer. The resulting structure is illustrated in FIG. 9.

As shown in FIG. 10, photoresist mask 810 is stripped and the surface of the resulting structure is thermally oxidized to form a gate oxide layer 910. Additional oxide is also formed on field oxide 124, border field oxide 150, bit line oxide 152, and bit line oxide 153. However, the silicon nitride layer 462 of ONO structures 160, 165 is generally self-retarding and prevents additional oxide from forming on the portions of silicon oxide layer 463 located over silicon nitride layer 462. This is because of the high energy required to form oxide over nitride layer 462. In one embodiment, a dry oxidization process is performed at 900° C. to create gate oxide layer 910 having a thickness of about in the range of about 80 to 150 angstroms. In the described embodiment, gate oxide layer 910 has a thickness of about 125 angstroms. Note that there is no requirement of forming and stripping a sacrificial oxide layer prior to forming gate oxide layer 910. The thickness of silicon nitride layer 462 is sufficient to protect the underlying substrate 110 from contamination which could otherwise result in the required use of a sacrificial oxide layer. Experimental results suggest that silicon nitride layer 462 should have a thickness of at least about 115 angstroms to eliminate the requirement of a sacrificial oxide layer.

A layer of photoresist is deposited over the surface of the resulting structure. This photoresist layer is exposed and developed to create photoresist mask 1010. Photoresist mask 1010 covers the semiconductor structure, except for the regions where low voltage logic transistors will be formed. Photoresist mask 1010 therefore exposes the region where low voltage transistor 120 is to be formed. A P-type impurity, such as boron, is implanted into this region to adjust the threshold voltage of the low voltage transistors. In accordance with one embodiment of the present invention, the P-type impurities are implanted with a dopant density of in the range of 5e11 to 1e13 ions/cm$^2$, and an implantation energy in the range of about 20 to 50 KeV. In another embodiment, the p-type impurities are implanted with a dopant density of in the range of 5e11 to 6e12 ions/cm$^2$, and an implantation energy in the range of about 20 to 40 KeV. In the described embodiment, the p-type impurities are implanted with a dopant density of 1.6e12 ions/cm$^2$ and with an implantation energy of 30 KeV. The low voltage threshold implant is illustrated by a single dashed line in substrate 110. Note that the region where low voltage logic transistor 120 is to be formed receives both the low voltage threshold implant and the high voltage threshold implant. This region is therefore illustrated with two dashed lines.

As shown in FIG. 12, the portion of gate oxide layer 910 that is exposed by photoresist mask 1010 is stripped by an oxide etch. In the described embodiment, the gate oxide etch is performed using 50:1 diluted HF at 24° C. for 120 seconds. Photoresist mask 1010 is then stripped, and the surface of the resulting structure is thermally oxidized. (FIG. 13) In one embodiment, the thermal oxidation step is a dry oxidization process performed at 900° C. The thermal oxidation step results in the growth of a gate oxide layer 125 in the region where low voltage logic transistor 120 is to be formed. Gate oxide layer 125 is grown to a thickness in the range of 80 to 150 angstroms. In the described embodiment, gate oxide layer 125 is grown to a thickness of about 115 angstroms. The thermal oxidation step also results in the thickening of gate oxide layer 910 in the region where high voltage logic transistor 130 is to be formed. This thickening is illustrated as an additional oxide layer 1310. Oxide layers 910 and 1310 combine to form gate oxide layer 135, which has a thickness in the range of 140 to 300 angstroms. In the described embodiment, gate oxide layer 135 has a thickness of about 190 angstroms. Additional oxide is also formed on field oxide 124, border field oxide 150 and bit line oxide layers 152–153. Bit line oxide layers 152–153, which had an initial thickness of about 600 Å, grow to a thickness in the range of about 1000 to 2000 angstroms, or 1000 to 1500 angstroms during the entire processing of the wafer. In the described embodiment, bit line oxide layers 152–153 grow to a thickness of about 1200 Å during the processing of the wafer. Silicon nitride layer 462 of ONO structures 160 and 165 are generally self-retarding and prevent additional oxide from forming on the portions of silicon oxide layer 463 located over silicon nitride layer 462.

Figure 14:
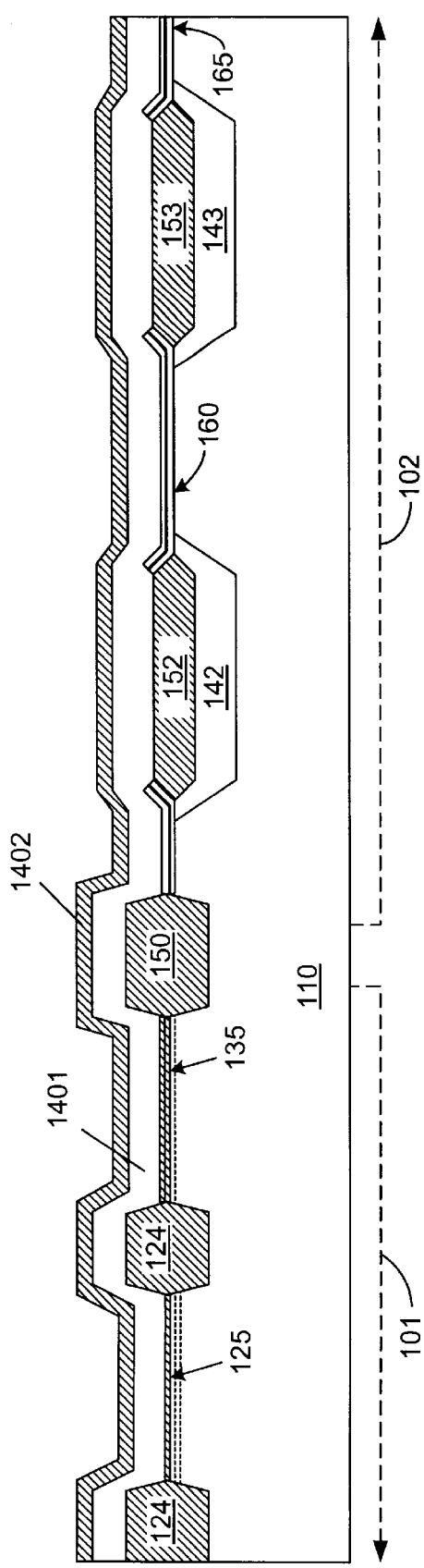

As illustrated in FIG. 14, a blanket layer of polysilicon 1401 is then deposited over the upper surface of the resulting structure. In some embodiments, phosphorus oxychloride (POCl$_3$) is used to dope polysilicon layer 1401 to increase the conductivity of polysilicon layer 1401. Other embodiments may implant impurities such as phosphorus ions to increase the conductivity of polysilicon layer 1401. A layer of metal silicide, such as tungsten silicide, is deposited directly on polysilicon layer 1401 to form metal silicide layer 1402. In an alternate embodiment, a blanket layer of a refractory metal, such as tungsten, titanium, or cobalt, is sputtered over the upper surface of polysilicon layer 1401.

Figure 15:
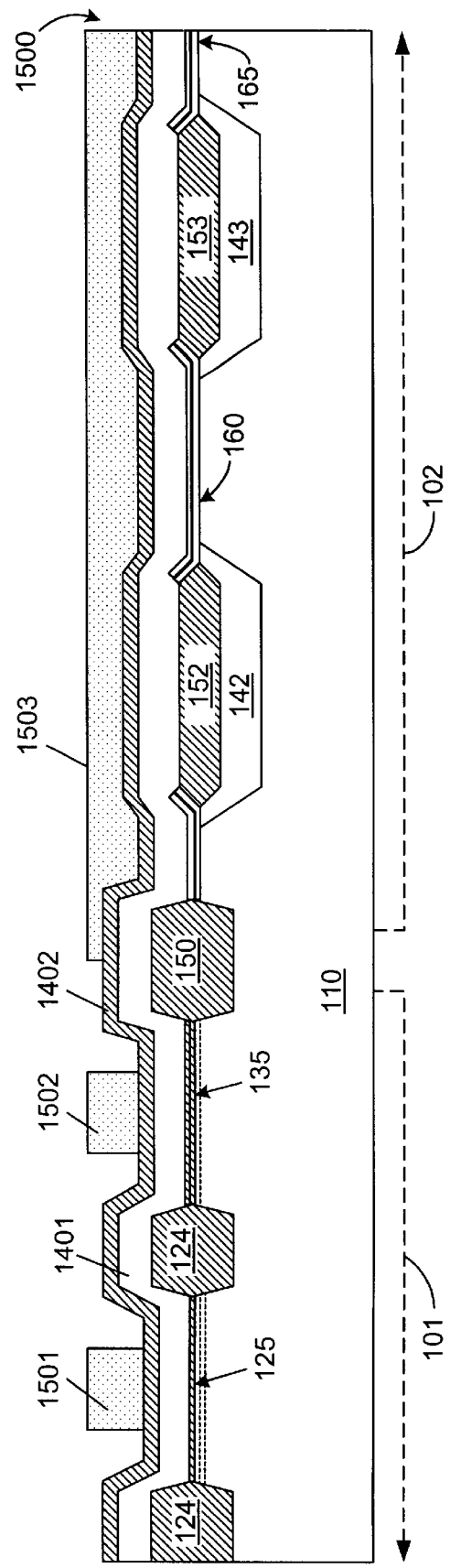
Figure 16:
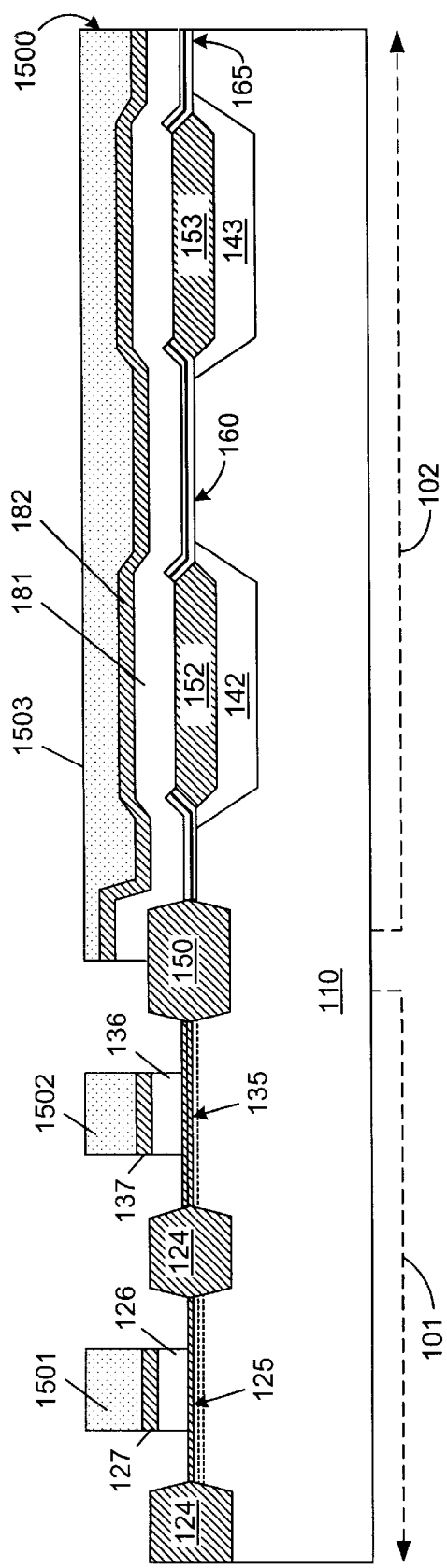

A layer of photoresist is then deposited over the resulting structure. This photoresist layer is exposed and developed to form photoresist mask 1500, as illustrated in FIG. 15. Photoresist mask 1500 is patterned to define the gates of the low voltage logic transistors, the high voltage logic transistors and the fieldless array transistors. For example, photoresist mask portion 1501 defines the gate 128 of low voltage logic transistor 120. Similarly, photoresist mask portion 1502 defines the gate 138 of high voltage logic transistor 130. Finally, photoresist mask portion 1503 defines the control gate 180 of fieldless array transistor 140.

An etch is then performed to remove the portions of metal silicide layer 1402 and polysilicon layer 1401 that are exposed by photoresist mask 1500. (FIG. 16) In one embodiment, this polycide etch is a dry etch. Tungsten silicide layer 1402 is etched with a gas mixture of HBr, SF$_6$ and He. Polysilicon layer 1401 is etched with a gas mixture of HBr and Cl$_2$ until about 20–30 Å are etched from the gate oxide layer.

After the polycide etch is completed, photoresist mask 1500 is stripped and a tungsten silicide anneal is then performed at 900° C. with low oxygen flow. (This anneal adheres the tungsten silicide to the underlying polysilicon and is part of the activation of the impurities in the buried diffusion bit lines 142–143). A boron implant is then performed to prevent current leakage between diffusion bit lines at the locations between adjacent gates electrodes in the fieldless array. This boron implant is a blanket implant, with no mask protection provided on the wafer. In one embodiment, boron is implanted at a dopant density in the range of 5e11 to 1e13 ions/cm$^2$ and an energy in the range of 20 to 50 KeV. In another embodiment, boron is implanted at a dopant density in the range of 5e11 to 6e12 ions/cm$^2$ and an energy in the range of 20 to 40 KeV. In the described embodiment, boron is implanted at a dopant density of 3e12 ions/cm$^2$ and an energy of 30 KeV. At this time, the state of the fieldless array is substantially illustrated by FIG. 2.

Figure 17:
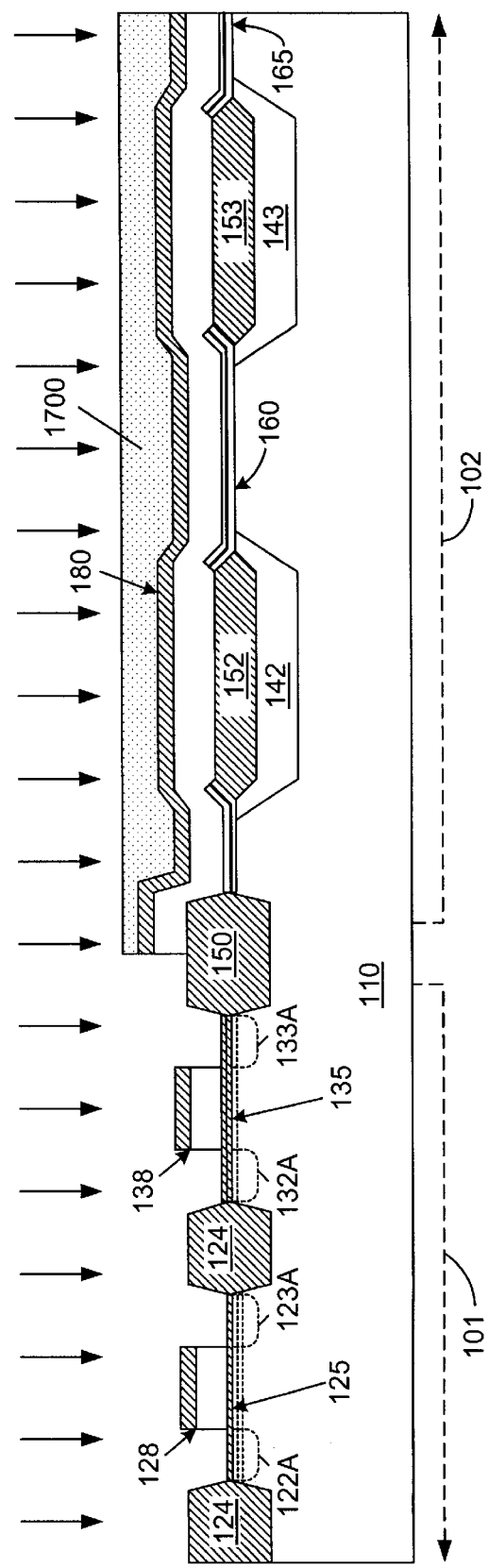

As illustrated in FIG. 17, a photoresist mask 1700 is then formed to protect the fieldless array transistors, and any p-channel transistors (not shown) fabricated in substrate 110. All n-type high voltage and low voltage CMOS transistors are exposed by mask 1700. A lightly doped drain (LDD) implant is performed, thereby implanting N-type impurities into regions 122A, 123A, 132A and 133A as illustrated. These regions are self-aligned with gate electrodes 128 and 138. In the described embodiment, the LDD implant is a four-step phosphorous implant performed in four steps, with each implant having a dosage in the range of 1e12 to 1e13 ions/cm$^2$ (for a total in the range of 4e12 to 4e13 ions/cm$^2$) and an energy of in the range of 60 to 120 KeV. In the described embodiment, each implant has a dosage of about 5e12 ions/cm$^2$ (for a total of 2e13 ions/cm$^2$) and an energy of 90 KeV. The substrate 110 is twisted 90 degrees after each of the steps, and the implant is performed at a high angle of 45 degrees in each step, thereby causing the dopant to extend under the edges of the polysilicon lines that are exposed by photoresist mask 1700.

A dielectric layer 1801 is then deposited over the resulting structure as illustrated in FIG. 1801. In one embodiment, dielectric layer 1801 is silicon oxide, deposited to a thickness in the range of 1000 to 2500 angstroms. In another embodiment, dielectric layer 1801 is silicon oxide, deposited to a thickness in the range of 1300 to 2200 angstroms. In the described embodiment, dielectric layer 1801 is silicon oxide, deposited to a thickness of about 2000 Å in accordance with conventional CMOS processing techniques. Dielectric layer 1801 is then etched back in accordance with conventional CMOS processing techniques to form dielectric spacers 129 and 139 as illustrated in FIG. 19.

Figure 20:
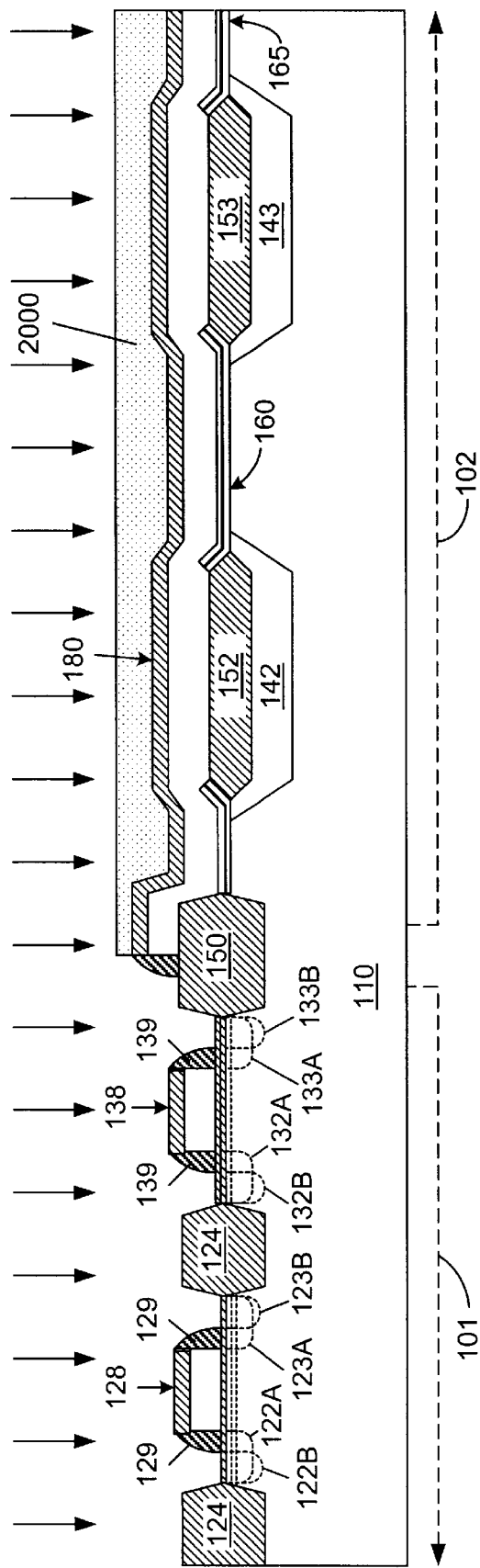
Figure 21:
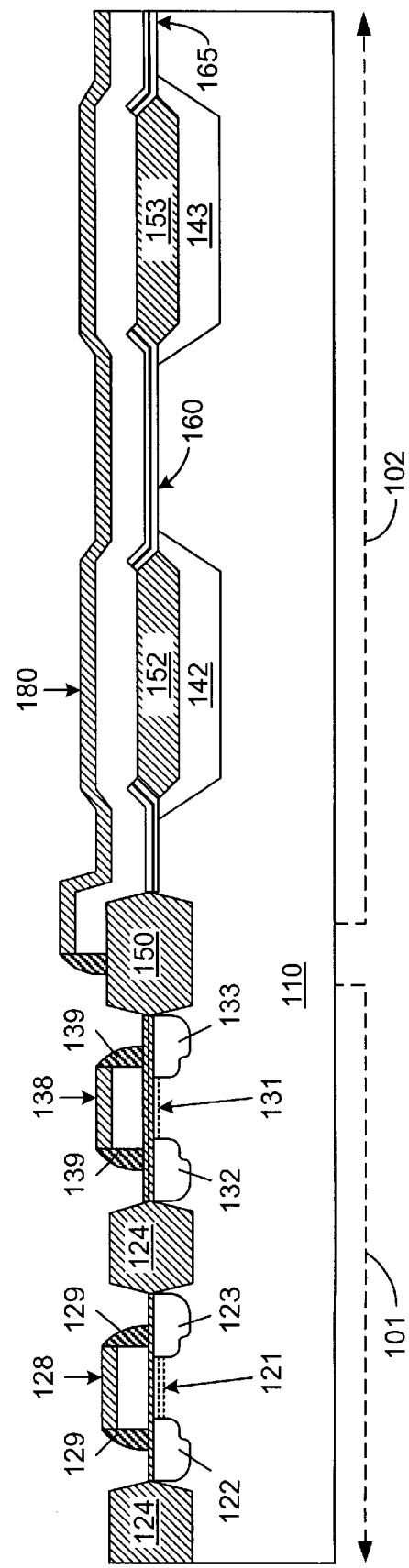

As illustrated in FIG. 20, a photoresist mask 2000 is then formed to protect the fieldless array transistors and any p-channel transistors (not shown) fabricated in substrate 110. All n-type high voltage and low voltage CMOS transistors are exposed by mask 2000. An N+ source/drain implant is then performed, thereby implanting N-type impurities into regions 122B, 123B, 132B and 133B, as illustrated in FIG. 20. In one embodiment, the N-type impurities are arsenic ions, which are implanted with a dopant density in the range of 1e14 to 6e15 ions/cm$^2$ at an implantation energy in the range of 25 to 100 KeV. In another embodiment, the N-type impurities are arsenic ions, which are implanted with a dopant density in the range of 5e14 to 5e15 ions/cm$^2$ at an implantation energy in the range of 30 to 100 KeV. In the described embodiment, the N-type impurities are arsenic ions, which are implanted with a dopant density of 3e15 ions/cm$^2$ at an implantation energy of 50 KeV. An anneal step is subsequently performed (during the formation of a dielectric layer that caps the above-described devices), thereby forming source/drain regions 122, 123, 132 and 133 as illustrated in FIG. 21.

In the above-described manner, high voltage CMOS logic transistors, low voltage CMOS logic transistors and fieldless array transistors can be fabricated on a single wafer using an efficient semiconductor process. It is noted that complementary p-channel transistors, whose fabrication has not been described in detail, are also formed on substrate 110 in a manner consistent with the above-described process.

The various embodiments of the structures and methods of this invention that are described above are illustrative only of the principles of this invention and are not intended to limit the scope of the invention to the particular embodiments described. For example, in view of this disclosure, those skilled in the-art can define other transistor types, floating gate structures, fieldless arrays, logic transistors, silicides, refractory metals, impurities, implantation voltages, implantation angles, dielectrics, floating gates, and so forth, and use these alternative features to create a method, semiconductor device, or integrated circuit according to the principles of this invention. Thus, the invention is limited only by the following claims.

What is claimed is:

1. A method for forming a fieldless array of floating gate transistors on a semiconductor region having a first conductivity type and a first surface, the method comprising the steps of:
    forming a first dielectric layer over the first surface of said semiconductor region having the first conductivity type;
    forming a floating gate layer over the first dielectric layer;
    forming a second dielectric layer over the floating gate layer;
    forming a mask over the second dielectric layer, the mask having openings that define a plurality of bit line regions of the floating gate transistors in the semiconductor region; and
    implanting a first impurity having the first conductivity type into the bit line regions of the semiconductor region, wherein the first impurity is implanted through the openings of the mask, the first dielectric layer, the floating gate layer, and the second dielectric layer.

2. The method of claim 1, wherein the step of implanting the first impurity further comprises the step of injecting the first impurity at a first angle with respect to the first surface of the semiconductor region, such that the first impurity is implanted in the semiconductor region at a first location under the mask.

3. The method of claim 2, wherein the step of implanting the first impurity further comprises the step of injecting the first impurity at a second angle with respect to the first surface of the semiconductor region, such that the first impurity is implanted in the semiconductor region at a second location under the mask.

4. The method of claim 3, wherein the first angle is an acute angle with respect to the first surface of the semiconductor region and the second angle is an obtuse angle with respect to the first surface of the semiconductor region.

5. The method of claim 4, wherein the first angle is approximately 65 degrees and the second angle is approximately 115 degrees with respect to the first surface of the semiconductor region.

6. The method of claim 1, wherein the step of forming the first dielectric layer over the first surface of the semiconductor region comprises oxidizing the first surface of the semiconductor region.

7. The method of claim 1, wherein the step of forming a second dielectric layer over the floating gate layer comprises oxidizing an upper surface of the floating gate layer.

8. The method of claim 1, wherein the floating gate layer comprises silicon nitride.

9. The method of claim 1, further comprising the steps of:
    etching the second dielectric layer through the openings in the mask; and then
    etching the floating gate layer through the openings in the mask.

10. The method of claim 9, further comprising the steps of:
    removing the mask; and then
    oxidizing the semiconductor region, thereby forming a plurality of bit line oxide regions over the bit line regions, and a plurality of floating gate structures which include the first dielectric layer, the floating gate layer and the second dielectric layer.

11. The method of claim 10, further comprising the step of forming a plurality of gate electrodes over the bit line oxide regions and the floating gate structures.

12. The method of claim 11, further comprising the step of configuring the gate electrodes perpendicular to the bit line oxide regions.

13. The method of claim 9, further comprising the step of implanting a second impurity into the semiconductor region through the openings in the mask, the second impurity having a second conductivity type opposite the first conductivity type.

14. The method of claim 13, wherein the second impurity is implanted at an angle of 90 degrees with respect to the first surface of the semiconductor region.

15. The method of claim 14, wherein the floating gate transistors have channel regions of the first conductivity type.

16. The method of claim 10, further comprising the step of forming field oxide over the semiconductor region, wherein the field oxide has a thickness about 15 to 20 times greater than a combined thickness of the first dielectric layer, the floating gate layer, and the second dielectric layer.

17. The method of claim 10, wherein the bit line oxide regions have a thickness on the order of 600 angstroms upon formation.

* * * * *